(12) United States Patent
Shum

(10) Patent No.: US 8,575,642 B1
(45) Date of Patent: Nov. 5, 2013

(54) OPTICAL DEVICES HAVING REFLECTION MODE WAVELENGTH MATERIAL

(75) Inventor: Frank Shum, Sunnyvale, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/600,988

(22) Filed: Aug. 31, 2012

Related U.S. Application Data

(63) Continuation-in-part of application No. 12/914,789, filed on Oct. 28, 2010, now Pat. No. 8,269,245.

(60) Provisional application No. 61/257,298, filed on Nov. 2, 2009, provisional application No. 61/257,303, filed on Nov. 2, 2009, provisional application No. 61/256,934, filed on Oct. 30, 2009.

(51) Int. Cl.
*F21V 9/00* (2006.01)
*H01L 21/00* (2006.01)

(52) U.S. Cl.
USPC .............. 257/98; 257/E33.059; 257/E33.073; 362/293; 438/27

(58) Field of Classification Search
CPC ................................. H01L 33/60; H01L 33/62
USPC ................ 257/79, 95, 98, E33.059, E33.073; 362/84, 293, 249.02; 438/22, 26, 27
See application file for complete search history.

(56) References Cited

U.S. PATENT DOCUMENTS

| | | |
|---|---|---|
| 6,335,771 B1 | 1/2002 | Hiraishi |
| 6,498,355 B1 | 12/2002 | Harrah et al. |
| 6,621,211 B1 | 9/2003 | Srivastava et al. |
| 6,864,641 B2 | 3/2005 | Dygert |
| 6,956,246 B1 | 10/2005 | Epler et al. |
| 7,009,199 B2 | 3/2006 | Hall |
| 7,083,302 B2 | 8/2006 | Chen et al. |
| 7,285,799 B2 | 10/2007 | Kim et al. |
| 7,560,981 B2 | 7/2009 | Chao et al. |
| 7,737,457 B2 | 6/2010 | Kolodin et al. |
| 7,791,093 B2 | 9/2010 | Basin et al. |
| 7,906,793 B2 | 3/2011 | Negley |
| 8,044,609 B2 | 10/2011 | Liu |
| 8,203,161 B2 | 6/2012 | Simonian et al. |
| 8,207,554 B2 | 6/2012 | Shum |
| 8,404,071 B2 | 3/2013 | Cope et al. |
| 8,410,711 B2 | 4/2013 | Lin et al. |
| 2001/0022495 A1 | 9/2001 | Salam |
| 2004/0190304 A1 | 9/2004 | Sugimoto et al. |
| 2004/0195598 A1 | 10/2004 | Tysoe et al. |
| 2004/0227149 A1 | 11/2004 | Ibbetson et al. |
| 2005/0199899 A1 | 9/2005 | Lin et al. |
| 2005/0224830 A1 | 10/2005 | Blonder et al. |
| 2006/0006404 A1 | 1/2006 | Ibbetson et al. |
| 2006/0038542 A1 | 2/2006 | Park et al. |

(Continued)

OTHER PUBLICATIONS

USPTO Office Action for U.S. Appl. No. 13/482,956 dated Feb. 14, 2013.

(Continued)

*Primary Examiner* — Nikolay Yushin
(74) *Attorney, Agent, or Firm* — Kilpatrick Townsend & Stockton LLP

(57) ABSTRACT

Techniques are disclosed for transmitting electromagnetic radiation such as ultra-violet, violet, blue, blue and yellow, and/or blue and green electromagnetic radiation, from LED devices fabricated on bulk semipolar or nonpolar materials and using phosphors. The substrate may include polar gallium nitride.

20 Claims, 14 Drawing Sheets

(56) References Cited

U.S. PATENT DOCUMENTS

| | | |
|---|---|---|
| 2006/0068154 A1 | 3/2006 | Parce et al. |
| 2006/0097385 A1 | 5/2006 | Negley |
| 2006/0205199 A1 | 9/2006 | Baker et al. |
| 2007/0018184 A1 | 1/2007 | Beeson et al. |
| 2007/0114563 A1 | 5/2007 | Paek et al. |
| 2007/0170450 A1 | 7/2007 | Murphy |
| 2007/0181895 A1 | 8/2007 | Nagai |
| 2008/0194054 A1 | 8/2008 | Lin et al. |
| 2008/0206925 A1 | 8/2008 | Chatterjee et al. |
| 2008/0210958 A1 | 9/2008 | Senda et al. |
| 2008/0261341 A1 | 10/2008 | Zimmerman et al. |
| 2009/0250686 A1 | 10/2009 | Sato et al. |
| 2009/0252191 A1 | 10/2009 | Kubota et al. |
| 2009/0309110 A1 | 12/2009 | Raring et al. |
| 2010/0001300 A1 | 1/2010 | Raring et al. |
| 2010/0006873 A1 | 1/2010 | Raring et al. |
| 2010/0149814 A1* | 6/2010 | Zhai et al. ............... 362/293 |
| 2010/0164403 A1 | 7/2010 | Liu |
| 2011/0038154 A1 | 2/2011 | Chakravarty et al. |
| 2011/0068700 A1 | 3/2011 | Fan |
| 2011/0069490 A1 | 3/2011 | Liu |
| 2011/0103064 A1 | 5/2011 | Coe-Sullivan et al. |
| 2011/0108865 A1 | 5/2011 | Aldaz et al. |
| 2011/0291548 A1 | 12/2011 | Nguyen The et al. |
| 2011/0317397 A1 | 12/2011 | Trottier et al. |
| 2012/0043552 A1 | 2/2012 | David et al. |
| 2012/0235201 A1 | 9/2012 | Shum |
| 2012/0299492 A1 | 11/2012 | Egawa et al. |
| 2012/0313541 A1 | 12/2012 | Egawa et al. |
| 2013/0043799 A1 | 2/2013 | Siu et al. |

OTHER PUBLICATIONS

Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.

International Search Report of PCT Application No. PCT/US2011/048499, dated Feb. 14, 2012, 2 pages total.

Sato et al., 'Optical Properties of Yellow Light-Emitting Diodes Grown on Semipolar (1122) Bulk GaN Substrate,' Applied Physics Letters, vol. 92, No. 22, 2008, pp. 221110-1-221110-3.

USPTO Office Action for U.S. Appl. No. 12/481,543 dated Jun. 27, 2011.

USPTO Office Action for U.S. Appl. No. 12/491,176 dated Mar. 1, 2012.

USPTO Office Action for U.S. Appl. No. 12/491,176 dated Jul. 19, 2012.

USPTO Office Action for U.S. Appl. No. 12/879,784 dated Jan. 25, 2012.

USPTO Notice of Allowance for U.S. Appl. No. 12/879,784 dated Apr. 3, 2012.

USPTO Office Action for U.S. Appl. No. 12/880,889 dated Feb. 27, 2012.

USPTO Office Action for U.S. Appl. No. 12/880,889 dated Sep. 19, 2012.

USPTO Office Action for U.S. Appl. No. 13/019,897 dated Mar. 30, 2012.

USPTO Office Action for U.S. Appl. No. 13/025,833 dated Jul. 12, 2012.

USPTO Office Action for U.S. Appl. No. 13/211,145 dated Oct. 17, 2012.

USPTO Office Action for U.S. Appl. No. 13/482,956 dated Aug. 17, 2012.

Csuti et al., 'Color-matching experiments with RGB-LEDs', Color Research and Application, vol. 33, No. 2, 2008, pp. 1-9.

Davis et al., 'Color Quality Scale', Optical Engineering 49(3), 2010, pp. 033602-1-033602-16.

Paper and Board Determination of CIE Whiteness, D65/10 (outdoor daylight), ISO International Standard 11475:2004E (2004), 18 pgs.

Whitehead et al., 'A Monte Carlo method for assessing color rendering quality with possible application to color rendering standards', Color Research and Application, vol. 37, No. 1, Feb. 2012, pp. 13-22.

USPTO Office Action for U.S. Appl. No. 13/019,897 dated Jan. 16, 2013.

USPTO Office Action for U.S. Appl. No. 13/210,769 dated Apr. 4, 2013.

USPTO Notice of Allowance for U.S. Appl. No. 13/298,905 dated Jun. 11, 2013.

* cited by examiner

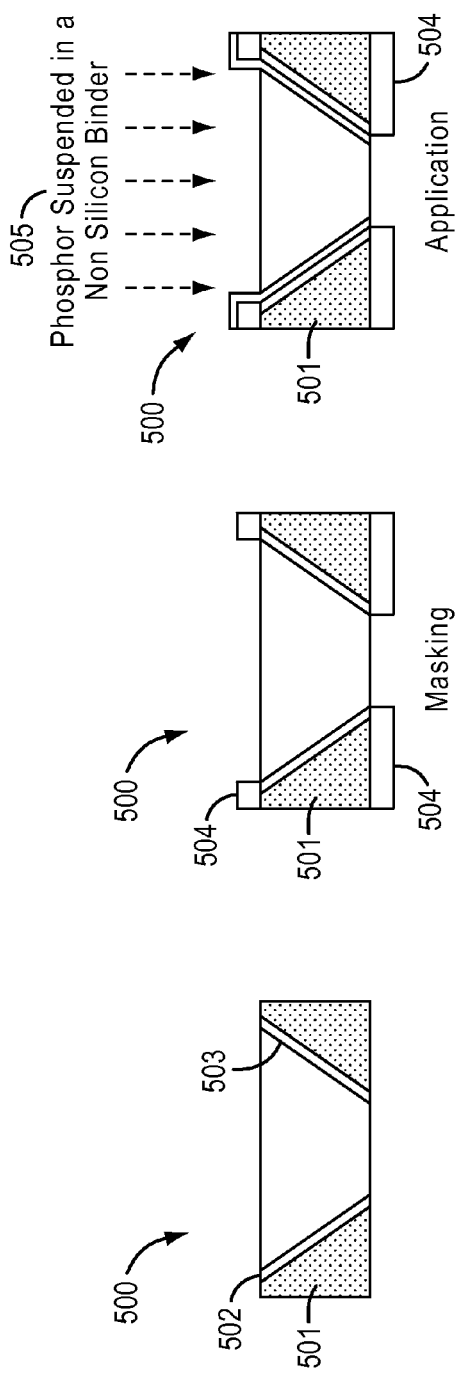

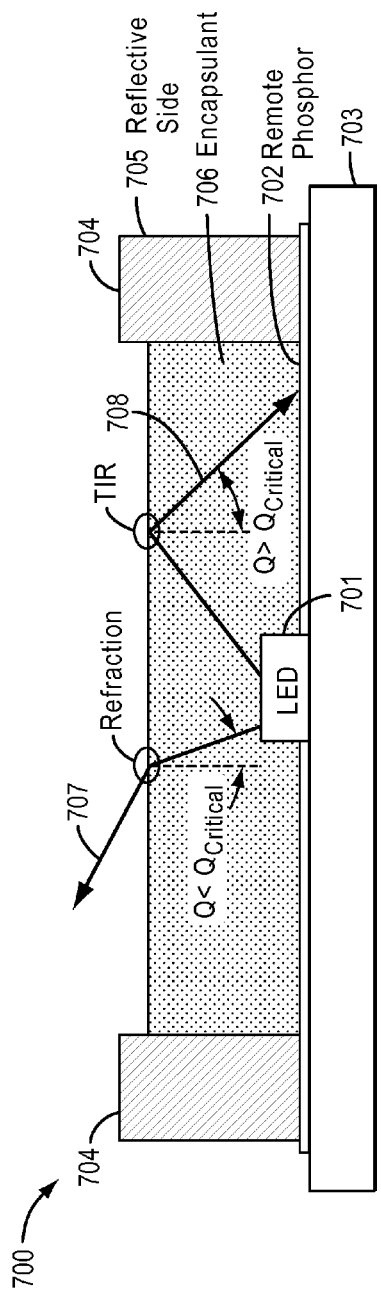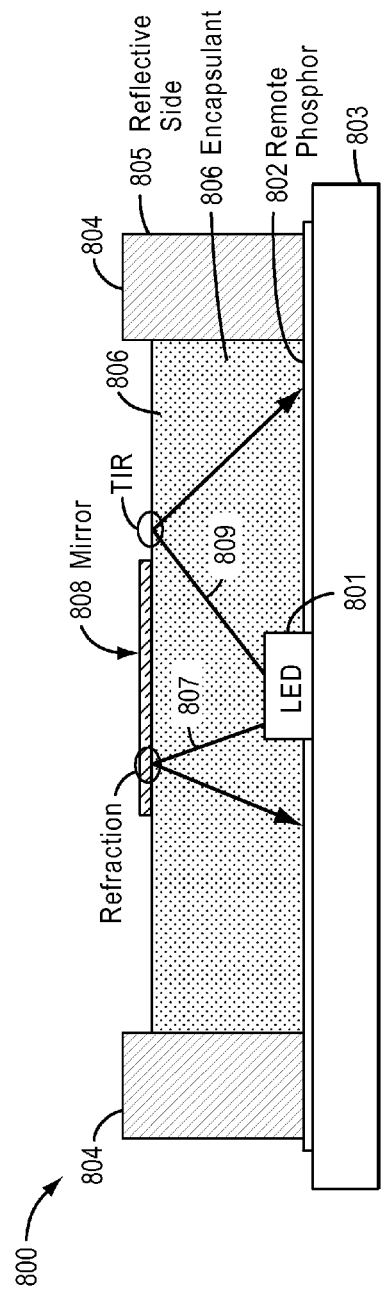
FIG. 7
FIG. 8

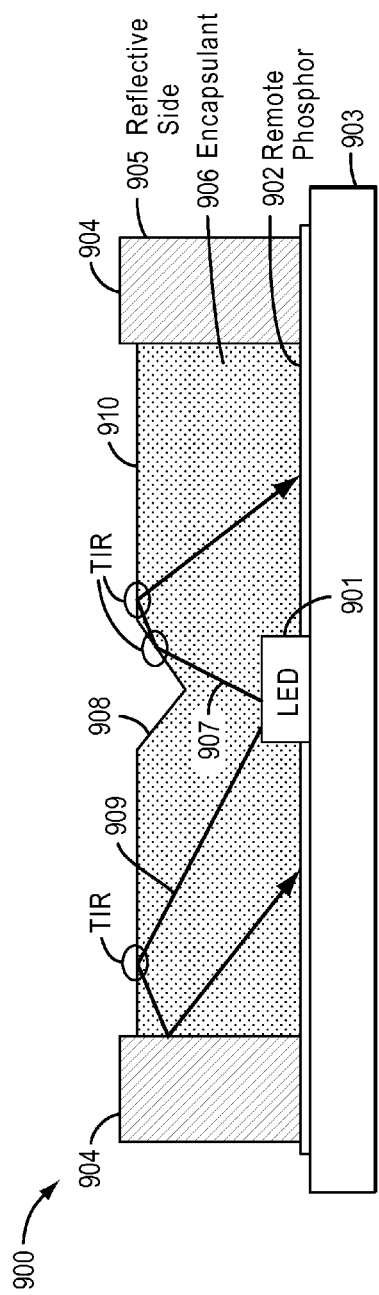
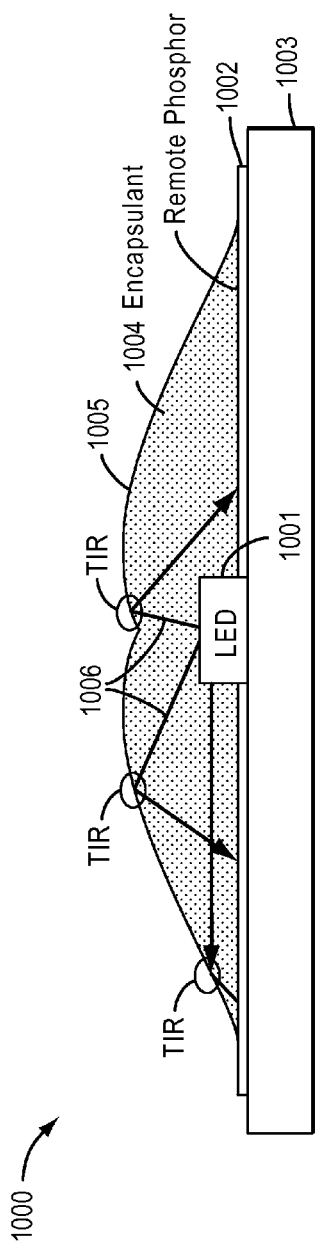
FIG. 9
FIG. 10

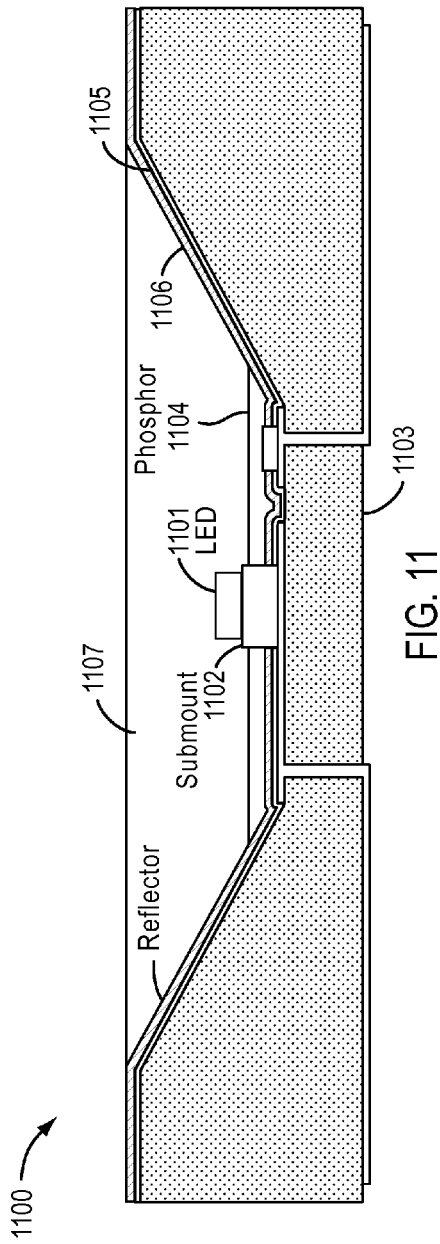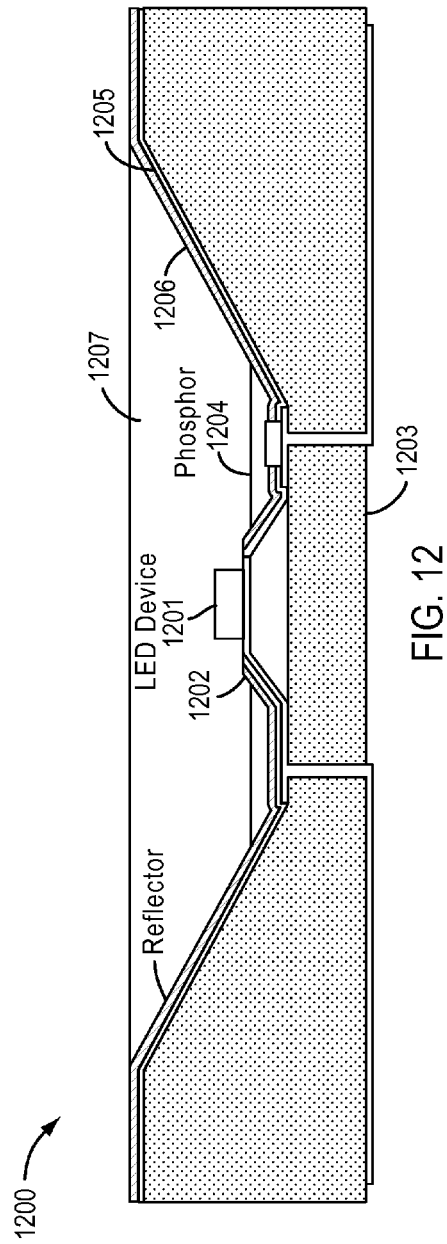

OPTICAL DEVICES HAVING REFLECTION MODE WAVELENGTH MATERIAL

This application is a continuation-in-part of, and claims priority to U.S. patent application Ser. No. 12/914,789, filed on Oct. 28, 2010 now U.S. Pat. No. 8,269,245, now allowed, which claims priority to U.S. Provisional Patent Application No. 61/257,298, filed on Nov. 2, 2009; U.S. Provisional Patent Application No. 61/257,303, filed on Nov. 2, 2009; and U.S. Provisional Patent Application No. 61/256,934, filed on Oct. 30, 2009, each of which is commonly owned, and incorporated by reference for all purposes.

BACKGROUND OF THE DISCLOSURE

This disclosure relates generally to lighting techniques, and more particularly to techniques for transmitting electromagnetic radiation from LED devices, such as ultra-violet, violet, blue, blue and yellow, and/or blue and green electromagnetic radiation, fabricated on bulk semipolar or nonpolar materials with use of wavelength converting materials such as phosphors, which emit light in a reflection mode. In certain embodiments, the substrate can include polar gallium nitride containing materials, and others. Merely by way of example, the disclosure can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC or DC power source. The conventional light bulb can be found commonly in houses, buildings, and outdoor lightings, and other areas requiring light. Unfortunately, the conventional light bulb dissipates more than 90% of the energy used as thermal energy. Additionally, the conventional light bulb routinely fails often due to thermal expansion and contraction of the filament element.

Fluorescent lighting overcomes some of the drawbacks of the conventional light bulb. Fluorescent lighting uses an optically clear tube structure filled with a halogen gas and mercury.

A pair of electrodes in the halogen gas is coupled to an alternating power source through ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light such as emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although successful, solid state lighting techniques must be improved for full exploitation of their potential.

From the above, it can be appreciated that techniques for improving optical devices is highly desired.

BRIEF SUMMARY OF THE DISCLOSURE

The present disclosure relates generally to lighting techniques and more particularly to techniques for transmitting electromagnetic radiation from LED devices, such as ultra-violet, violet, blue, blue and yellow, and/or blue and green electromagnetic radiation, fabricated on bulk semipolar or nonpolar materials with use of wavelength conversion materials such as phosphors, which emit light in a reflection mode. In certain embodiments, the substrate can include polar gallium nitride containing materials, and others. Merely by way of example, the disclosure can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

According to certain embodiments, the present disclosure provides an optical device. The device includes a substrate member having a surface region. The device also includes at least one LED configured overlying one or more portions of the surface region. The device further includes a spacer member having two or more sidewalls, the sidewall being characterized by an angle. The device additionally includes at least one wavelength conversion material disposed overlying the one or more sidewalls. The device also includes an optical member having a wavelength selective surface configured to block substantially direct emission of the at least one LED and configured to transmit at least one selected wavelength of reflected emission caused by an interaction of the reflected emission with the wavelength conversion material.

According to certain embodiments, the present disclosure provides an optical device. The device includes a substrate member having a surface region. The device also includes at least one LED configured overlying one or more portions of the surface region. The device further includes at least one wavelength conversion material disposed over the surface region. Additionally, the device includes an optical member having a wavelength selective surface configured to block substantially direct emission of the at least one LED and configured to transmit at least one selected wavelength of reflected emission caused by an interaction of the reflected emission with the wavelength conversion material.

One or more benefits may be achieved using one or more of the embodiments disclosed herein. As an example, the present device and method provides for an improved lighting technique with improved efficiencies. In certain embodiments, the present method and resulting structure are easier to implement using conventional technologies. In a specific embodiment, a blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers, although there can also be some variations.

BRIEF DESCRIPTION OF THE DRAWINGS

FIG. 5A through FIG. 5E are simplified diagrams illustrating a processing of coating phosphor material according to certain embodiments.

FIG. 7 illustrates an encapsulated LED, where the phosphor is coated on to the upper surface of the substrate member.

FIG. 8 illustrates a portion of the exit aperture below the critical angle that is covered by a mirror, according to an embodiment of the present disclosure.

FIG. 9 is a simplified diagram illustrating an LED package having a shaped exit aperture, according to embodiments of the present disclosure.

FIG. 10 is a simplified diagram illustrating an LED package having a shaped exit aperture, according to embodiments of the present disclosure.

FIG. 11 is a simplified diagram illustrating an LED package having reflective, angled sidewalls, according to certain embodiments of the present disclosure.

FIG. 12 is a simplified diagram illustrating an LED package having recess regions for phosphor material, according certain embodiments of the present disclosure.

DETAILED DESCRIPTION OF THE DISCLOSURE

The present disclosure relates generally to lighting techniques and more particularly to techniques for transmitting electromagnetic radiation from LED devices, such as ultraviolet, violet, blue, blue and yellow, and/or blue and green electromagnetic radiation, fabricated on bulk semipolar or nonpolar materials with use of wavelength conversion materials such as phosphors, which emit light in a reflection mode. In certain embodiments, a substrate can include polar gallium nitride containing materials, and others. Merely by way of example, the disclosure can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

The term "dome" refers to a rigid or semi-rigid shape having at least one concave surface.

The term "dichroic" refers to a material that reflects light at a first wavelength or at a first wavelength range, and passes, transmits, or is transparent to light at a second wavelength or at a second wavelength range.

Reference is now made in detail to certain embodiments. The disclosed embodiments are not intended to be limiting of the claims.

Figure 1:
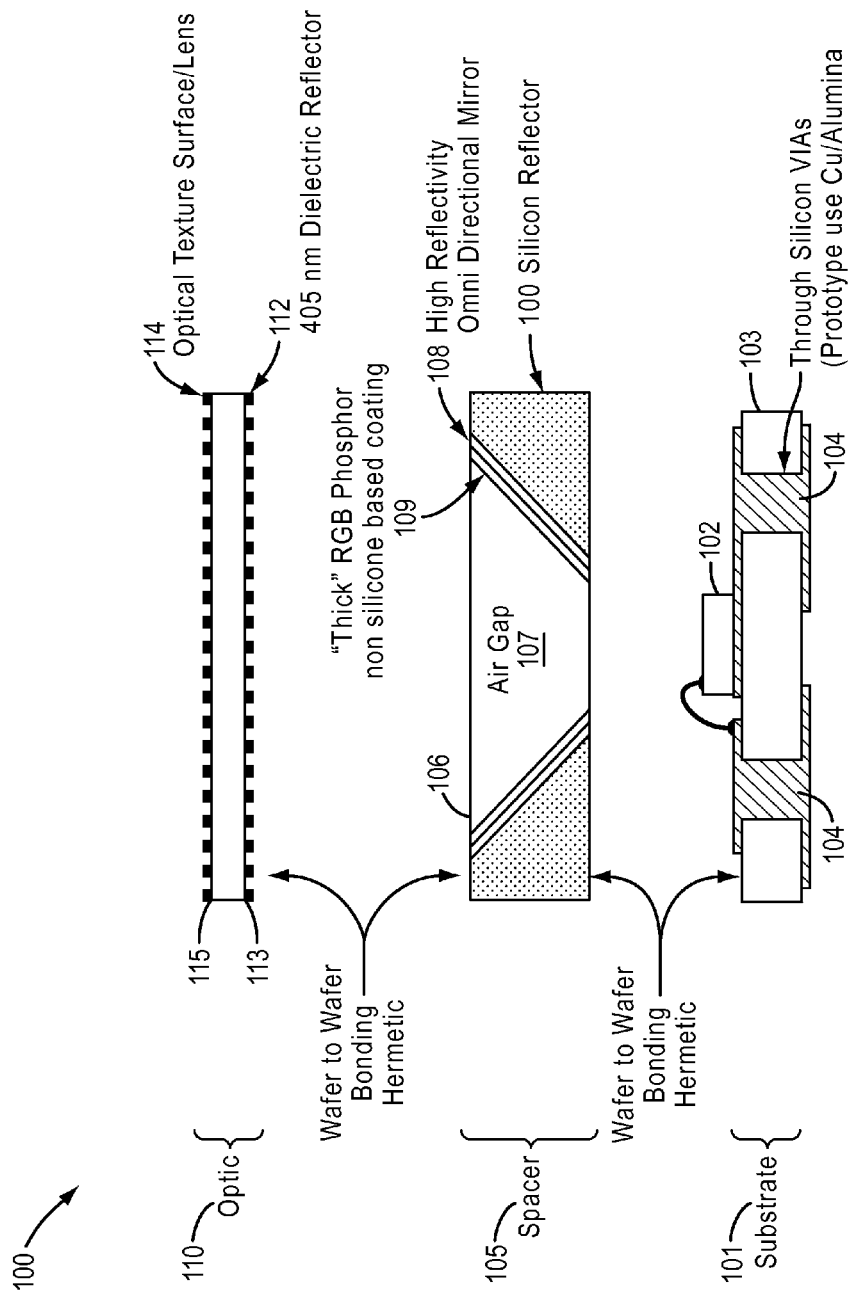
FIG. 1 is a simplified diagram illustrating an LED package, according to an embodiment of the present disclosure.

As explained above, conventional LED-based optical devices are often inadequate. One of the challenges has been that light emitted by LED devices is not being efficiently emitted. More specifically, an LED device is positioned on a substrate and covered by an optic. FIG. 1 is a simplified diagram 100 illustrating an LED package according to an embodiment of the present disclosure. As shown in FIG. 1, the LED package comprises an optic, a spacer, and a substrate. An LED device is positioned on the substrate. Among other things, the LED package is configured to achieve a high efficiency where the phosphor disposed on the sidewalls of the spacer operates in reflection. In one embodiment, these components are fabricated at the wafer level and assembled before singulated into individual parts.

In further detail, the optical device illustrated in FIG. 1, substrate 101 includes an LED 102 mounted on wafer 103 having silicon through vias 104. Spacer 105 includes angled sidewalls 106 defining air gap 107. A high reflectivity omni-directional coating 108 is disposed on sidewalls 106 and a thick RGB phosphor, non-silicone based coating 109 is disposed on the coating 108. The optic 110 includes dielectric reflective regions 112 on the surface 113 facing the LED 102 and an optionally textured surface and/or lens 114 on the surface 115 directed away from the LED 102. The optic 110 may be attached to the spacer 105 and/or the spacer 105 may be attached to substrate 101 using wafer-to-wafer bonding methods, which in certain embodiments can form a hermetic seal. In certain embodiments, the dielectric reflective region may extend across the surface 113 of optic 110.

Figure 2A:
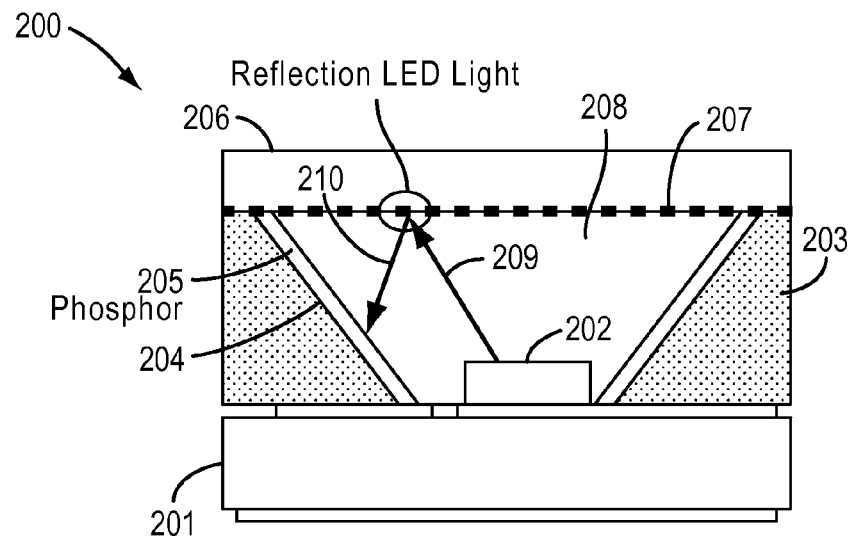
FIG. 2A is a simplified diagram illustrating light paths in an LED package, according to certain embodiments.
Figure 2B:
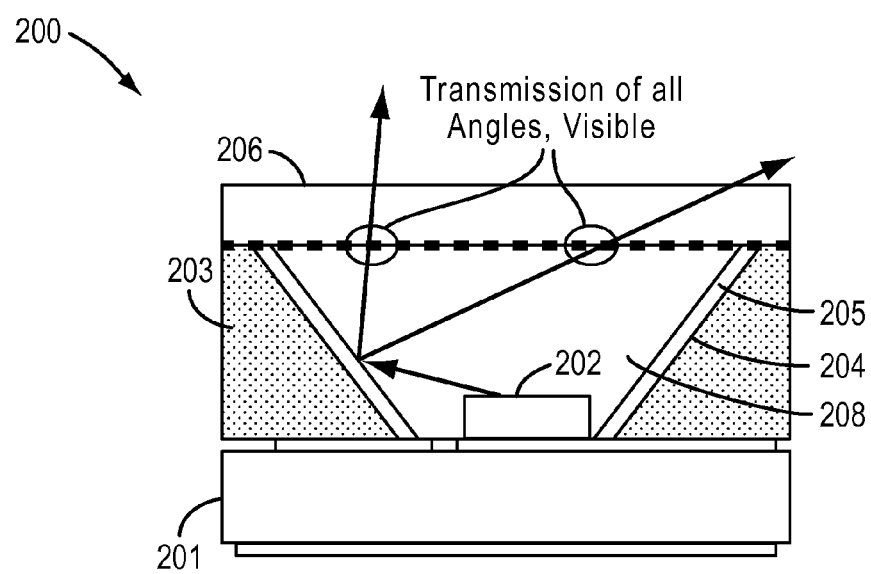
FIG. 2B is a simplified diagram illustrating light paths in an LED package, according to certain embodiments.

FIG. 2A and FIG. 2B are simplified diagrams illustrating light paths in an LED package 200. The LED package 200 includes a substrate 201, an LED device 202, a spacer 203 having angled sidewalls 204 on which is deposited a phosphor layer 205. An optic 206 is mounted on top of the spacer 203 and includes wavelength reflective regions 207 disposed on the surface facing LED 202. The spacer 203 and the optic 206 define an air gap region 208. As shown in FIG. 2, the bottom layer of the optic 206 is coated with regions having wavelength selective regions 207 such as a dielectric filter. The dielectric filter can be a long pass filter that reflects the majority of light emitted by the LED 209, but transmits the majority of the light emitted by the phosphor having a longer wavelength 210. For example, the dielectric reflector 207 can reflect light of 405 nm (e.g., blue or violet color) back to the phosphor material 205 on spacer to cause the 405 nm light emitted by the LED device to be absorbed by the phosphor material 205. Depending on the types of phosphor and/or LED device used, the dielectric reflector 207 may be configured to reflect other wavelength(s) as well. The dielectric reflector may be disposed on certain regions of the optic or may be disposed across the entire surface of the optic. A dielectric reflective layer may be disposed on one or both surfaces of the optic.

FIG. 2A and FIG. 2B is a simplified diagram illustrating a dielectric filter used in an LED package. As shown in FIG. 2B, LED light of certain wavelength 209 (e.g., around 405 nm) is reflected back by the optic 206 onto the phosphor material 205 on the sidewalls 204 of spacer 203. The phosphor material 205 converts the reflected light 209 into a different wavelength 210, and the converted light 210 passes through the optic 206.

Figure 3:
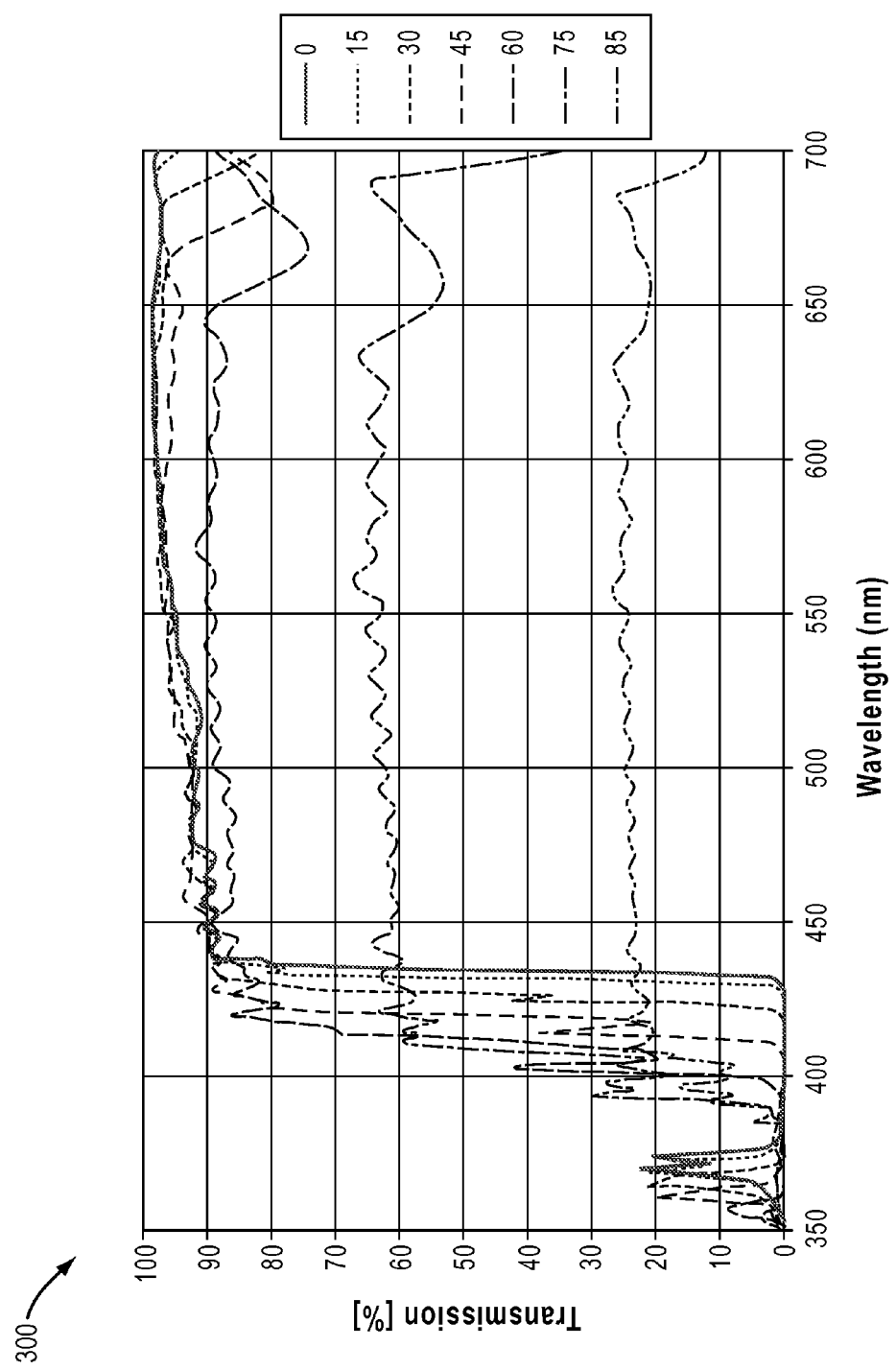
FIG. 3 is a diagram illustrating the reflectivity (% Transmission) of a dielectric filter designed to reflect 405 nm LED light as a function of the incident angle.

FIG. 3 is a simplified diagram 300 illustrating the reflectivity (% Transmission) of a dielectric filter designed to reflect 405 nm LED light as a function of incident angle. In an embodiment, the top surface of the optic has a textured surface to diffuse the transmitted light.

Figure 4A:
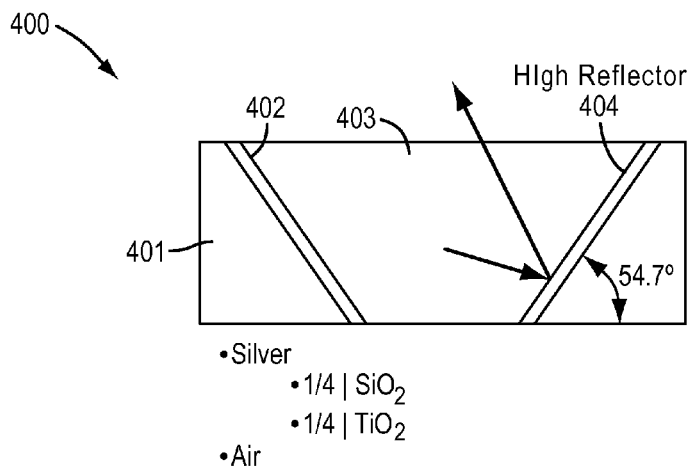
FIG. 4A illustrates a spacer with cavity walls coated with a highly reflective coating, according to embodiments of the present disclosure.
Figure 4B:
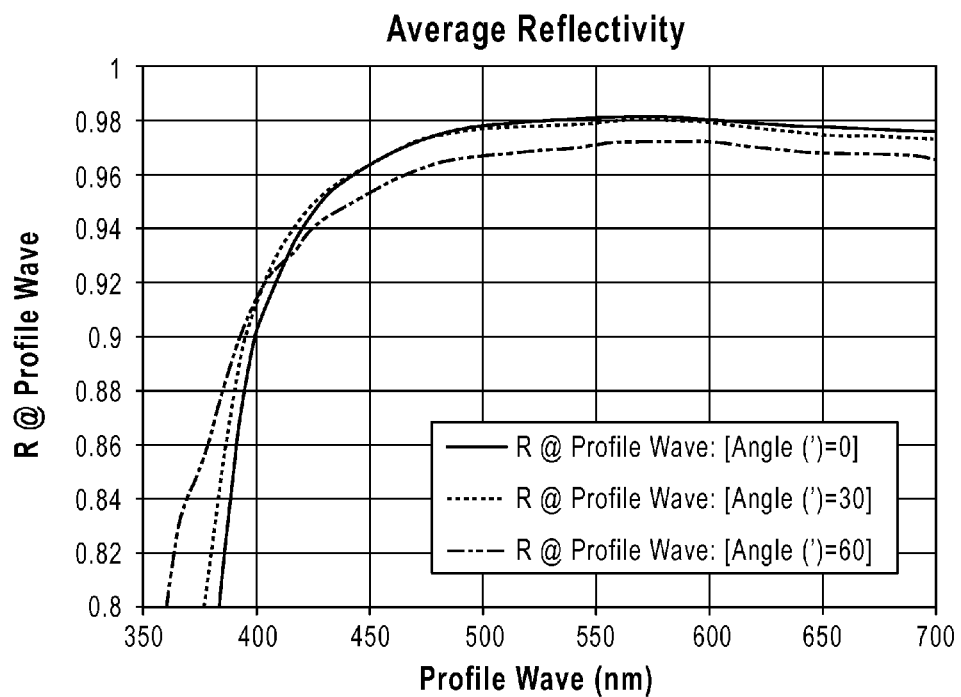
FIG. 4B illustrates the reflectivity of the highly reflective coating of FIG. 4A as a function incident angle.

In certain embodiments, the spacer can be configured to separate the optic from the substrate to leave a cavity for the LED. In various embodiments, the spacer is approximate 250 µm to 2,000 µm thick. In one embodiment, the cavity is formed by etching silicon along the 1-0-0 plane to resulting in an etched facets walls have an angle of between about 50 degrees to about 60 degrees. Theses facet walls may be coated with a high reflectivity coating to form a high reflectivity cavity. In certain embodiments, the coating comprises a layer of silver coated with a quarter wave thickness of $SiO_2$ and quarter wave thickness of $TiO_2$. FIG. 4A illustrates a simplified diagram 400 of a spacer with cavity walls coated with the highly reflective coating according to certain embodiments of the present disclosure. As shown in FIG. 4A, spacer 401 includes sidewalls 402 having an angle of 54.7°, and which define air gap 403. Sidewalls 402 are coated with a highly reflective coating 404 comprising a quarter wavelength thickness of $SiO_2$ and/or $TiO_2$. The quarter wavelength thickness is selected as appropriate for the wavelength or wavelength range intended to be reflected. FIG. 4B shows the reflectivity of the highly reflective coating as a function of both wavelength of the incident light and the angle of incidence.

In certain embodiments, the high reflector coating is further coated with a layer of phosphor-containing material. In certain embodiments, the layer of phosphor is sufficiently thick such that almost all the incident light is back scattered and little of it reaches the mirrored surface, e.g., the highly reflective coating. This results in only a small amount of light emitted from the LED reaching the mirrored surface.

FIG. 5A through FIG. 5E is a simplified diagram 500 that illustrates a processing of coating phosphor material. FIG. 5A shows a spacer 501 having angled sidewalls 502 on which a highly reflective coating (mirrored surface) 503 is deposited. As shown in FIG. 5B, a masked 504 is deposited on portions of the spacer 501. A phosphor suspended, for example, in a non-silicone binder 505 is deposited or applied to the spacer 501 as shown in FIG. 5C. In FIG. 5D, the binder is baked off, and as shown in FIG. 5E, the mask 504 is removed, to leave a phosphor layer 506 on mirrored surface 503.

Figure 6:
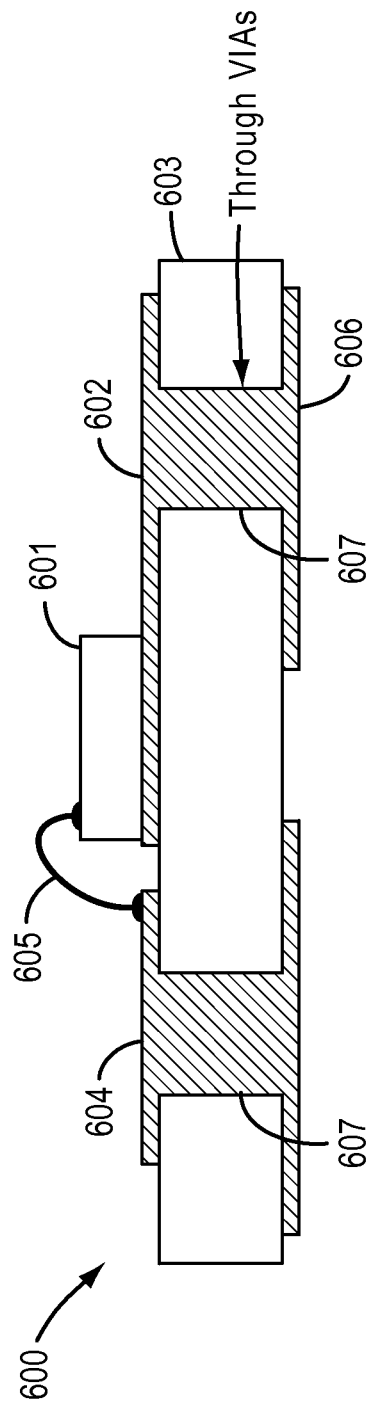
FIG. 6 is a simplified diagram illustrating an LED device electrically coupled to a conductive material with through vias, according to an embodiment of the present disclosure.

FIG. 6 is a simplified diagram 600 illustrating an LED device electrically coupled to a conductive material with through vias, according to an embodiment of the present disclosure. The LED device shown in FIG. 6 includes an LED 601, mounted on electrically conductive pads 602 disposed on a wafer 603. LED 601 may be electrically connected to adjoining conductive pads 604 by, for example, a wire bond 605. Electrical contact pads 602 and 604 may be electrically connected to electrically conductive areas on the opposite side 606 of wafer 603 by through vias 607.

Coating the phosphor on the side walls has advantages, including: (i) the output of the aperture is not blocked by the phosphor coating thereby enabling higher emission efficiencies; (ii) the phosphor can be coated on surfaces that can have a heat sink to cool the phosphor; and (iii) phosphor backscattering is used advantageously to increase reflection from the package surfaces.

The LED device is mounted on a thermally conductive but electrically insulating substrate. The substrate has electrically conductive patterns formed on the top and bottom surfaces. These top and bottom electrically conductive patterns are connected by through vias. In one embodiment, the substrate is made of a ceramic material such as alumina or alumina nitride. For example, the vias are fabricated by laser drilling and plating. In another embodiment, the substrate is made of silicon. The surface of the silicon is made electrically insulating by a formation of a thermal oxide of $SiO_2$ on top of which the electrically conductive patterns are formed. Through the silicon material, vias are used to connect the top and bottom conductive patterns. In another embodiment, the vias are formed by etching holes.

As explained above, it is often desirable to direct reflected light to a phosphor material, which converts the reflected light from at least one wavelength or wavelength range to another wavelength or wavelength range. In various embodiments, the present disclosure provides optical geometries based on total internal reflection to achieve an LED package in which the phosphor is positioned in a reflection geometry. Using a phosphor in refection mode has several advantages over traditional phosphor transmission geometries.

FIG. 7 is a simplified diagram 700 that illustrates an encapsulated LED, wherein the phosphor is coated on to the floor of an LED package. The portion of the LED emission greater than the critical angle of 100% reflected back into the package to be absorbed by the phosphor. However, there is a portion of the light emission that is below the critical angle and that is transmitted from the package. One of the goals of the configurations provided by the present disclosure is to minimize the light transmitted from the LED package below the critical angle. FIG. 7 shows an LED 701 and phosphor coating 702 disposed on substrate 703. The LED package includes sidewalls 704 having a reflective surface 705 and an encapsulant 706 within the cavity defined by the package. Refractive light 707 and internally reflected light 708 emitted by LED 701 are also shown.

FIG. 8 is a simplified diagram 800 that illustrates a portion of the exit aperture below the critical angle that covered by a mirror according to an embodiment of the present disclosure. As shown in FIG. 8, the light emitted from the LED at less than the critical angle is now reflected back onto the phosphor. FIG. 8 shows an LED 801 and phosphor coating 802 disposed on substrate 803. The LED package includes sidewalls 804 having a reflective surface 805 and an encapsulant 806 within the cavity defined by the package. High angle light 807 emitted by LED 801 is reflected from mirror 808 onto the phosphor coating 802 and low angle light 809 is reflected at the surface 810 of encapsulant 806 by total internal reflection.

FIG. 9 is a simplified diagram 900 illustrating an LED package having a shaped aperture according to embodiments of the present disclosure. As shown, a portion of the exit aperture is shaped to ensure that all rays emitted directly from the LED will totally internally reflected back onto the phosphor. FIG. 9 shows an LED 901 and phosphor coating 902 disposed on substrate 903. The LED package includes sidewalls 904 having a reflective surface 905 and an encapsulant 906 within the cavity defined by the package. High angle light 907 emitted by LED 901 is reflected from shaped aperture 908 by internal reflection onto the phosphor coating 902 and low angle light 909 is reflected at the surface 910 of encapsulant 906 by total internal reflection.

FIG. 10 is a simplified diagram 1000 illustrating an LED package having a shaped exit aperture according to embodiments of the present disclosure. As shown, the exit aperture has a curved shape, which substantially eliminates the need of the reflective sides. In various embodiments, the reflectors are provided on the sides of the substrate. FIG. 10 shows an LED 1001 and phosphor coating 1002 disposed on substrate 1003. The LED package includes an encapsulant 1004 disposed over the LED 1001 and having a curved surface shape 1005. Light 1006 emitted by LED 1001 is reflected from curved shape 1005 by total internal reflection onto the phosphor coating 1002.

FIG. 11 is a simplified diagram 1100 illustrating an LED package according to an embodiment of the present disclosure. For example, in reflection mode, LED package comprises phosphor material residing on the same surface as the LED. For example, the phosphor layer can be tens to hundreds of micron thick. This thickness can block the light emitting surfaces of the LED. The LED package as shown in FIG. 11 includes a submount on the substrate that raises the LED device above the surface of the phosphor. FIG. 11 shows LED 1101 on submount 1102 disposed on substrate 1103. A thick phosphor layer 1104 is disposed on the surface of the substrate 1103 surrounding LED 1101. The package includes angled sidewalls 1105 coated with a reflective layer 1106. An encapsulant 1107 fills the cavity formed by the LED 1101, the phosphor layer 1104 and the reflective angled sidewalls 1105.

FIG. 12 is a simplified diagram 1200 illustrating an LED package having recess regions for phosphor material according to an embodiment of the present disclosure. As shown, a portion of floor of the LED package is raised where the LED device 1210 is mounted. For example, for package made of silicon, the raised platform is formed during the etching process. FIG. 12 shows LED 1201 on raised surface 1202 disposed on substrate 1203. A thick phosphor layer 1204 is disposed on the recessed surface of the substrate 1203 surrounding LED 1201. The package includes angled sidewalls 1205 coated with a reflective layer 1206. An encapsulant 1207 fills the cavity formed by the LED 1201, the phosphor layer 1204 and the reflective angled sidewalls 1105.

It is to be appreciated that there are other embodiments as well. For example, LED packages having other configurations of wavelength conversion material are described in U.S. Application Publication No. 2011/0186887, which is incorporated by reference herein for all purposes.

Figure 13:
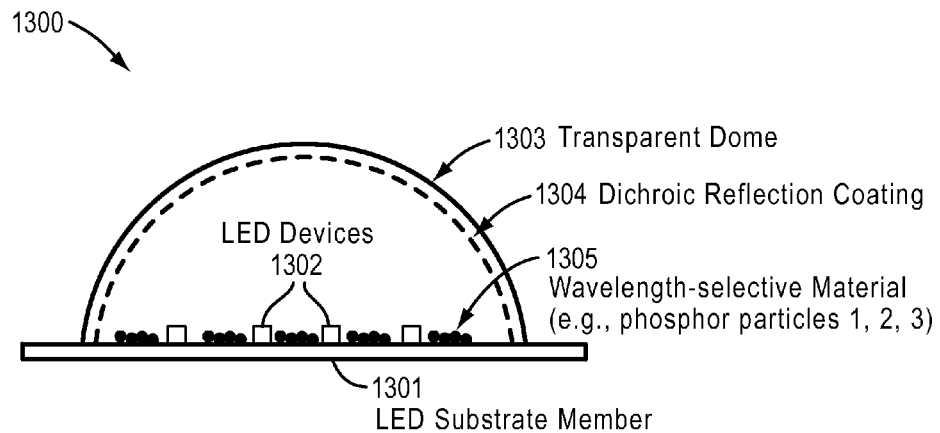
FIG. 13 is a simplified diagram illustrating an LED package having recess regions for phosphor material and a dichroic reflection coating disposed on a surface of a transparent dome, according to certain embodiments of the present disclosure.

FIG. 13 is a simplified diagram illustrating an LED package having recess regions for phosphor material and a dichroic reflection coating upon a surface of a transparent dome. As shown, the embodiment depicts an optical device 1300 built using a substrate member 1301 having an upper surface upon which upper surface light emitting diode (LED) devices 1302 are mounted so as to emit light at first selected wavelengths (e.g. a wavelength range of about 395 nm to about 430 nm). Also shown is a transparent dome 1303 with a dichroic reflection coating 1304 that serves as a reflective member surrounding the LED devices 1302. In certain embodiments, phosphor particles 1305 are disposed on the upper surface of the substrate 1301 (e.g., in close proximity to the LED devices 1302) and at least some of the phosphor particles 1305 are wavelength-selective at a first wavelength (e.g., wavelengths in a range of about 395 nm to about 430 nm). As shown, the wavelength-selective material 1305 are disposed on the upper surface of the substrate member 1301, and may also be disposed below the upper surface of the LED devices 1302. In operation, the wavelength-selective material 1305 emits light at second wavelength (e.g., wavelengths of about 440 nm to about 800 nm) in response to incidence of light at the first selected wavelength (e.g., light from the LED devices 1302). A reflective member 1304 (e.g., the transparent dome with at least a portion of the transparent dome having a dichroic reflection coating) surrounds the LED devices 1302, and allows substantially all light at the second selected wavelengths to escape from the optical device.

Figure 14:
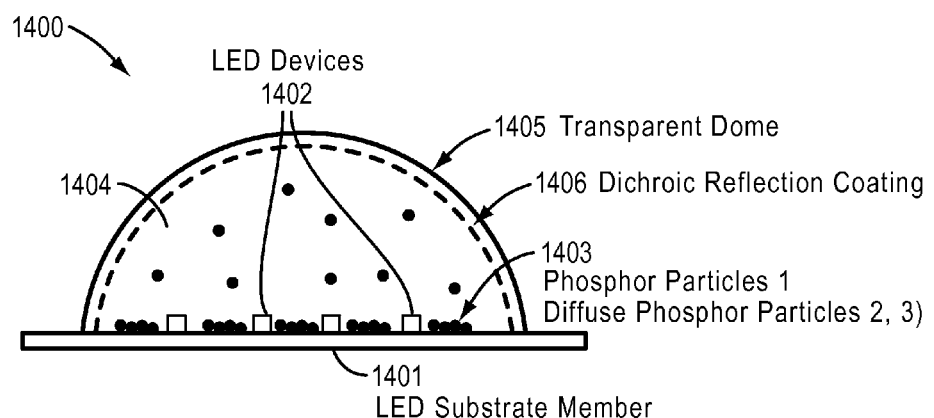
FIG. 14 is a simplified diagram illustrating an LED package having recess regions for a first phosphor material disposed on the upper surface of the substrate, and for a second material and a third phosphor material dispersed within a volume bounded by a transparent dome, according to certain embodiments of the present disclosure.

FIG. 14 is a simplified diagram illustrating an LED package having recess regions for phosphor material and a dichroic reflection coating upon a surface of a transparent dome. As shown, the embodiment depicts an optical device 1400 built using a substrate member 1401 having an upper surface upon which upper surface a light emitting diode (LED) device 1402 is mounted so as to emit light at first selected wavelengths (e.g. wavelength range of about 395 nm to about 430 nm). In certain embodiments, phosphor particles 1403 are disposed on the upper surface of the substrate 1401 in close proximity to the LED devices 1402 as well as substantially throughout the volume 1404 bounded by the transparent dome 1405. At least some of the wavelength-materials 1403 (e.g., phosphor particles) are wavelength-selective at a first wavelength (e.g., absorbing light at a first wavelength and emitting light at a second wavelength). And, at least some other phosphor particles 1403 are wavelength-selective at the second wavelength (e.g., absorbing light at the second selected wavelength and emitting light at a third selected wavelength).

As shown, a reflective member (e.g., the transparent dome 1405 with at least a portion of the transparent dome having a dichroic reflection coating 1406) surrounds the LED devices 1402, and allows substantially all light at the second and third selected wavelengths to escape from the optical device.

Figure 15A:
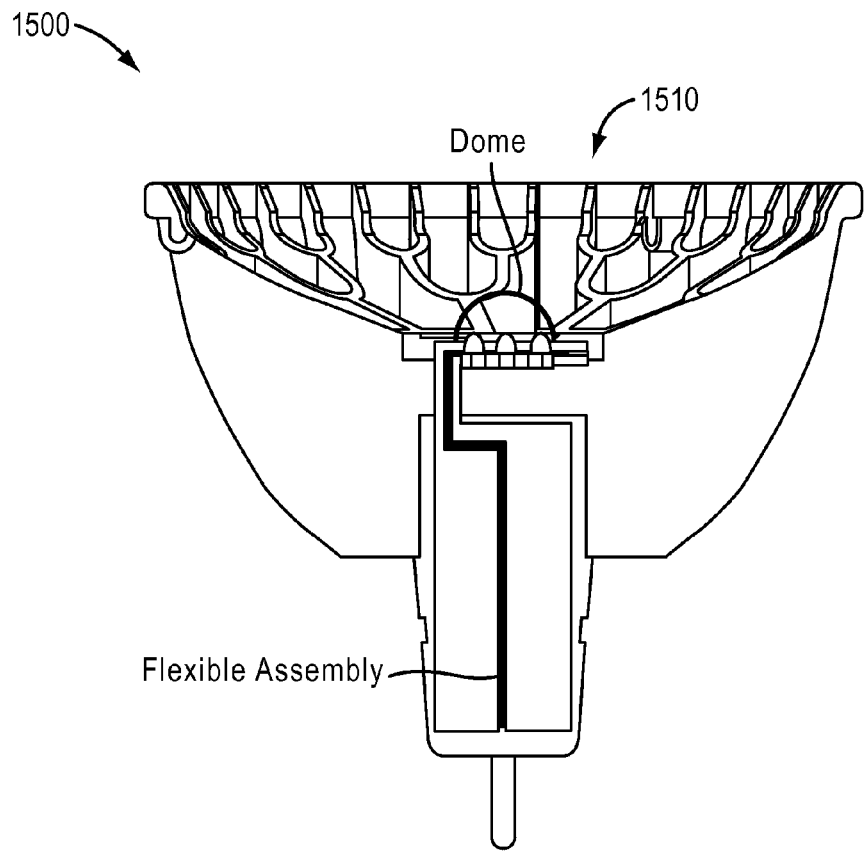
FIG. 15A is a simplified diagram illustrating an LED package mounted within the form factor of an MR-16 lamp, according to certain embodiments of the present disclosure.
Figure 15B:
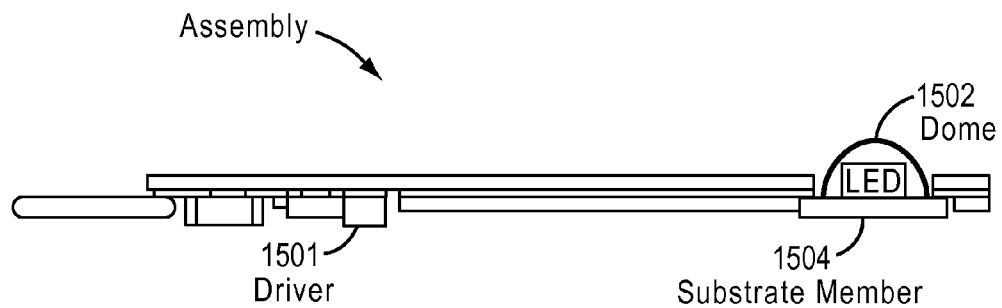
FIG. 15B is a diagram of the flexible assembly shown in FIG. 15A.

FIG. 15A is a simplified diagram illustrating an optical device 1500 in the embodiment of an LED package mounted within the form factor of an MR-16 lamp 1510 As shown, the dome surrounds the LED devices, and the LED devices are mounted into an assembly to connect to a power source. The assembly (e.g., including the transparent dome) is disposed as an integral component of an MR-16 lamp. FIG. 15B shows details of the flexible assembly shown in FIG. 5A, including a driver 1501, a dome 1502 over LED 1503 mounted on substrate member 1504.

Figure 16A:
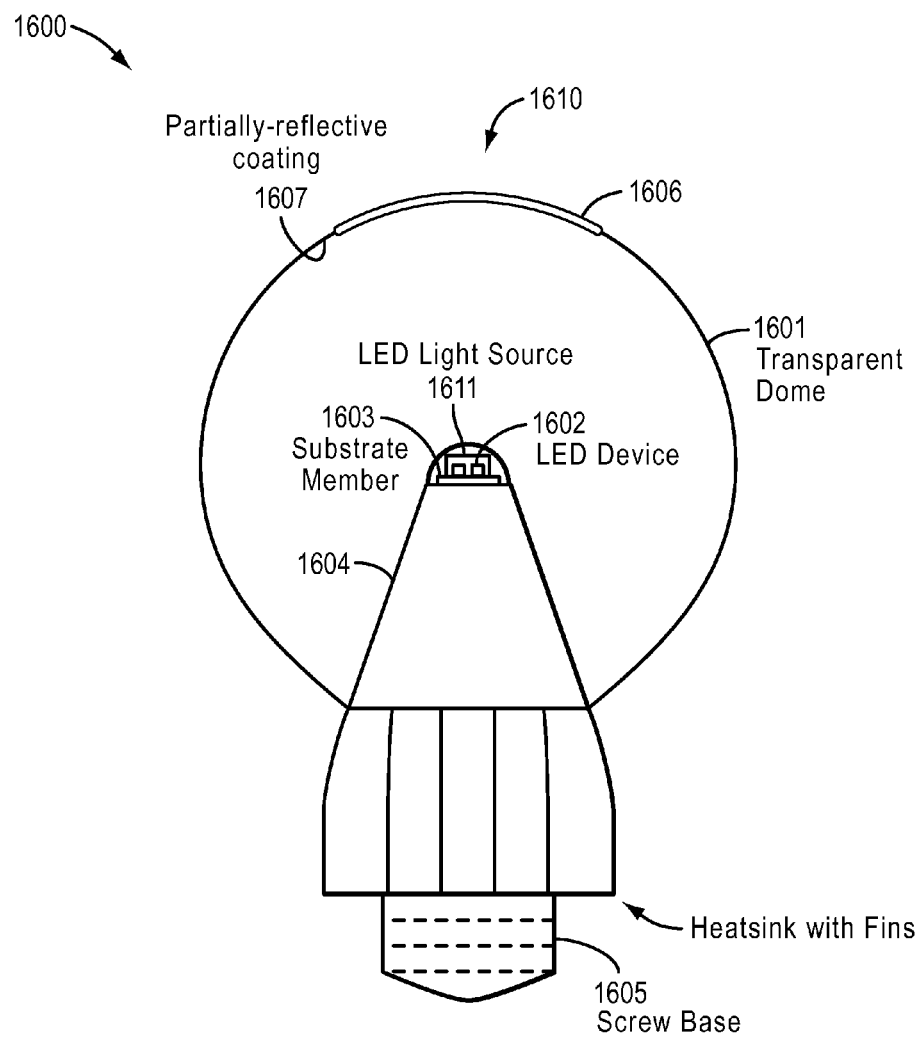
FIG. 16A is a simplified diagram illustrating an LED package mounted within the form factor of an A lamp, according to certain embodiments of the present disclosure.

FIG. 16A is a simplified diagram illustrating an optical device 1600 in an embodiment of an LED package mounted within the form factor of an A lamp 1610. As shown, the bulb of the A-lamp forms a transparent dome 1601 that surrounds light source 1611 including LED devices 1602 mounted to substrate 1603, and the LED devices 1602 are mounted into an assembly 1604 (e.g., a heat sink), which in turn is connected to a screw base 1605 to connect to a power source. The assembly (e.g., including the transparent dome and the LED devices) is disposed as an integral component of an A-lamp. In this embodiment, a portion 1606 of the bulb 1601 is coated with a partially-reflective coating 1607. The bulb surrounds the LED devices.

Figure 16B:
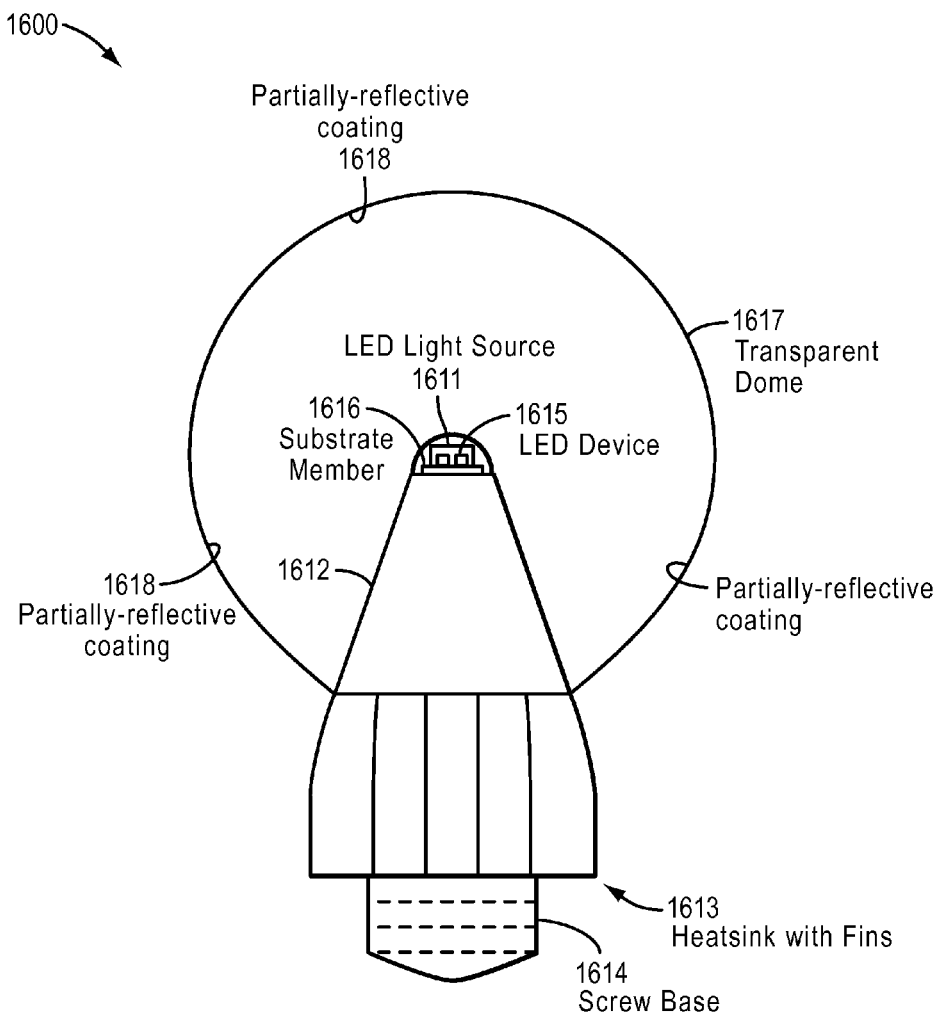
FIG. 16B is a simplified diagram illustrating an LED package mounted within the form factor of an A-lamp, according to certain embodiments of the present disclosure.

FIG. 16B is a simplified diagram illustrating an LED package mounted within the form factor of an A-lamp. In this embodiment, substantially all of the bulb is coated with a partially-reflective coating. The bulb surrounds the LED devices.

FIG. 16B shows a form factor of an A-lamp with an LED light source 1611 mounted on an assembly 1612, that includes a heatsink with fins 1613 connected to a screw base 1614. LED light source 1611 includes LED devices 1615, mounted to a substrate member 1616. The bulb includes a transparent dome 1617, the inner surface of which is coated with a partially reflective coating 1618.

Figure 17:
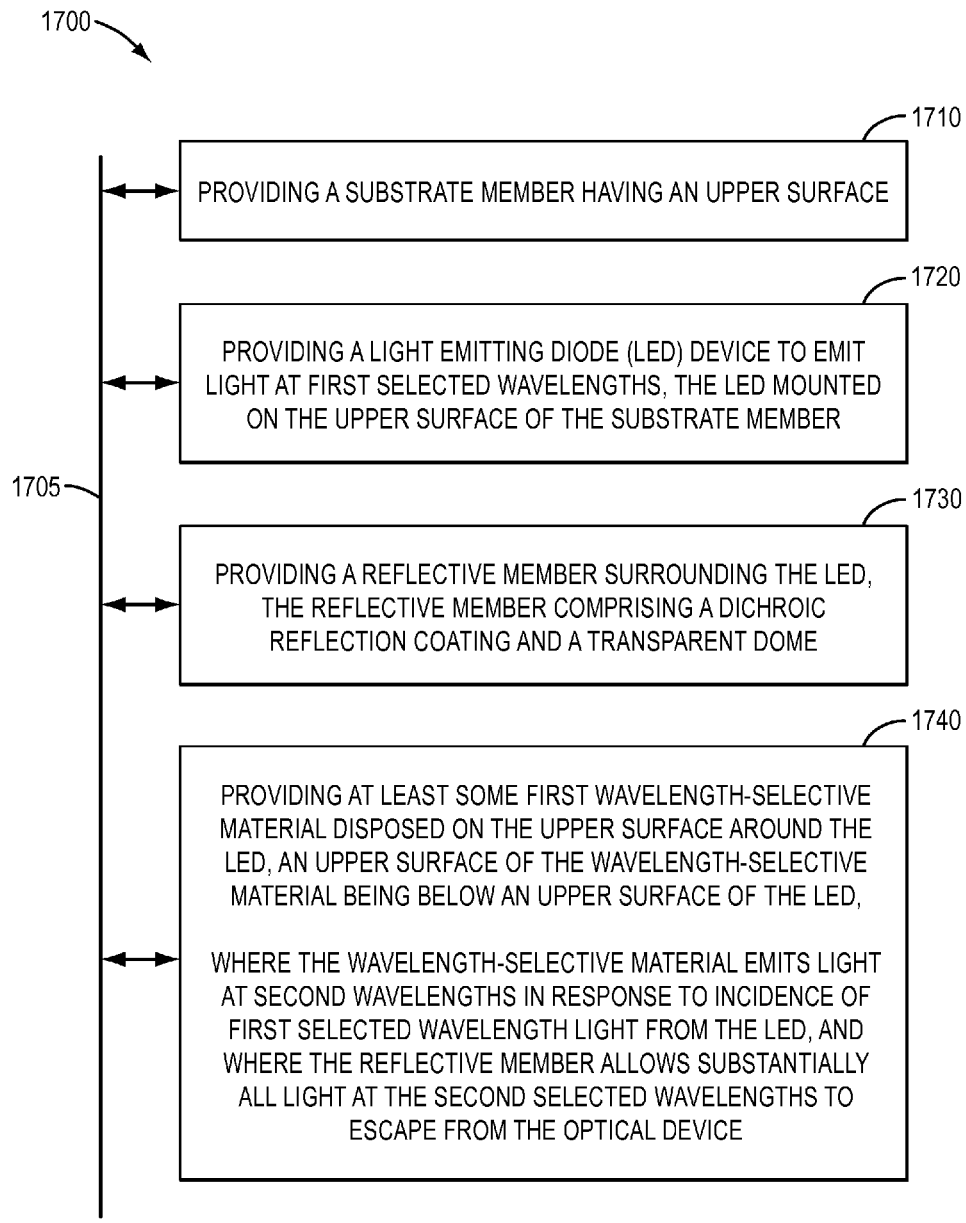
FIG. 17 is a simplified diagram illustrating a method of manufacturing optical devices provided by the present disclosure having reflection mode wavelength material.

FIG. 17 is a simplified diagram illustrating a method for manufacturing embodiments of the herein-disclosed optical devices having reflection mode wavelength material, according to a method embodiment of the present disclosure. FIG. 17 depicts a block diagram of a fabrication system to perform certain functions of a computer system. System 1700 comprises at least one processor and at least one memory, the memory serving to store program instructions corresponding to the operations of the system. As shown, an operation can be implemented in whole or in part using program instructions accessible by a module. The modules of the fabrication system are connected to a communication path 1705, and any module can communicate with other modules over communication path 1705. The modules of the system can, individually or in combination, perform method operations within system 1700. Any operations performed within system 1700 may be performed in any order unless as may be specified in the claims. The embodiment of FIG. 17 implements a portion of a computerized fabrication system, shown as system 1700, comprising a computer processor to execute a set of program code instructions and modules for accessing memory to hold program code instructions to perform: providing a substrate member having an upper surface (see module 1710); providing a light emitting diode (LED) device to emit light at first selected wavelengths, the LED mounted on the upper surface of the substrate member (see module 1720); providing a reflective member surrounding the LED, the reflective member comprising a dichroic reflection coating and a transparent dome (see module 1730); and providing at least some first wavelength-selective material disposed on the upper surface around the LED, an upper surface of the wavelength-selective material being below an upper surface of the LED, where the wavelength-selective material emits light at second wavelengths in response to incidence of first selected wavelength light from the LED and where the reflective member allows substantially all light at the second selected wavelengths to escape from the optical device (see module 1740).

Wavelength conversion materials can be ceramic or semiconductor particle phosphors, ceramic or semiconductor plate phosphors, organic or inorganic downconverters, upconverters (anti-stokes), nano-particles and other materials which provide wavelength conversion. Some examples are listed below:

$(Srn,Ca_{1-n})_{10}(PO_4)_6*B_2O_3:Eu^{2+}$ (where $0\le n\le 1$)
$(Ba,Sr,Ca)_5(PO_4)_3(Cl,F,Br,OH):Eu^{2+},Mn^{2+}$
$(Ba,Sr,Ca)BPO_5:Eu^2,Mn^{2+}$
$Sr_2Si_3O_8*2SrCl_2:Eu^{2+}$
$(Ca,Sr,Ba)_3MgSi_2O_8:Eu^{2+}, Mn^{2+}$
$BaA_{18}O_{13}:Eu^{2+}$
$2SrO*_{0.84}P_2O_5*0.16B_2O_3:Eu^{2+}$
$(Ba,Sr,Ca)MgAl_{10}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2(Mg,Zn)Si_2O_7:Eu^{2+}$
$(Mg,Ca,Sr,Ba,Zn)_2Si_{1-x}O_{4-2x}:Eu^{2+}$ (where $0\le x\le 0.2$)
$CaMgSi_2O_6: Eu^{2+}$
$(Sr,Ca,Ba)(Al,Ga)_2S_4:Eu^{2+}$
$(Ca,Sr)_8(Mg,Zn)(SiO_4)_4C_{12}:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^+$
$(Y,Gd,Tb,La,Sm,Pr,Lu)_3(Sc,Al,Ga)_{5-n}O_{12-3/2n}:Ce^{3+}$ (where $0\le n\le 0.5$)
$ZnS:Cu+,Cl$—
$(Y,Lu,Th)_3Al_5O_{12}:Ce^+$
$ZnS:Cu^+,Al^{3+}$
$ZnS:Ag^+,Al^{3+}$
$ZnS:Ag^+,Cl^-$
$LaAl(Si_{6-z}Al_z)(_{10-z}O_z):Ce^{3+}$ (where z=1)
$(Ca,Sr) Ga_2S_4:Eu^{2+}$
$AlN:Eu^{2+}$
$SrY_2S_4:EU^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$CaWO_4$
$(Y,Gd,La)_2O_2S:Eu^{3+}$
$(Y,Gd,La)2O_3:Eu^{3+}$
$(Ba,Sr,Ca)_nSi_nN_n:Eu^{2+}$ (where 2n+4=3n)
$Ca_3(SiO_4)C_{12}:Eu^{2+}$
$(Y,Lu,Gd)_{2-n}C_{an}Si_4N_{6+n}C_{1-n}:Ce^{3+}$, (where $0\le n\le 0.5$)
$(Lu,Ca,Li,Mg,Y)$ alpha-SiAlON doped with $Eu^{2+}$ and/or $Ce^{3+}$
$(Ca,Sr,Ba)SiO_2N_2:Eu^{2+},Ce^{3+}$
$Ba_3MgSi_2O_8:Eu^{2+},Mn^{2+}$
$(Sr,Ca)AlSiN_3:Eu^{2+}$
$CaAlSi(ON)_3:Eu^{2+}$
$Ba_3MgSi2O_8:Eu^{2+}$
$LaSi_3N_5:Ce^{3+}$
$Sr_{10}(PO_4)_6C_{12}:Eu^{2+}$
$(BaSi)O_{12}N_2:Eu^{2+}$
M(II)aSibOcNdCe:A where (6<a<8, 8<b<14, 13<c<17, 5<d<9, 0<e<2) and M(II) is a divalent cation of (Be,Mg,Ca,Sr,Ba,Cu,Co,Ni,Pd,Tm,Cd) and A of (Ce,Pr,Nd,Sm,Eu,Gd,Tb,Dy,Ho,Er,Tm,Yb,Lu,Mn,Bi,Sb)
$SrSi_2(O,Cl)_2N_2:EU^{2+}$
$SrSi_9Al_{19}ON_{31}:Eu^{2+}$
$(Ba,Sr)Si_2(O,Cl)_2N_2:Eu^{2+}$
$LiM_2O_8:Eu^{3+}$ where M=(W or Mo)

For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

Further, it is to be understood that nanoparticles, quantum dots, semiconductor particles, and other types of materials can be used as wavelength converting materials. The list above is representative and should not be taken to include all the materials that may be utilized within embodiments described herein.

The above has been generally described in terms of one or more entities that may be one or more phosphor materials or phosphor like materials, but it would be recognized that other "energy-converting luminescent materials," which may include one or more phosphors, semiconductors, semiconductor nanoparticles ("quantum dots"), organic luminescent materials, and the like, and combinations of them, can also be used. In one or more embodiments, the energy converting luminescent materials can generally be one or more wavelength converting material and/or materials or thicknesses of them. Furthermore, the above has been generally described in electromagnetic radiation that directly emits and interacts with the wavelength conversion materials, but it would be recognized that the electromagnetic radiation can be reflected and then interacts with the wavelength conversion materials or a combination of reflection and direct incident radiation.

In certain embodiments, the present specification describes one or more specific gallium and nitrogen containing surface orientations, but it would be recognized that any one of a plurality of family of plane orientations can be used. Therefore, the above description and illustrations should not be taken as limiting the scope of the present disclosure which is defined by the appended claims.

What is claimed is:

1. An optical device comprising:
   a substrate member having an upper surface;
   a light emitting diode (LED) device configured to emit light in a first selected wavelength range, the LED device mounted on the upper surface of the substrate member;
   a reflective member surrounding the LED device, the reflective member comprising:
   a dichroic reflection coating; and
   a transparent dome;
   a first wavelength-selective material disposed on the upper surface of the substrate member, an upper surface of the wavelength-selective material being below an upper surface of the LED device;
   a second wavelength-selective material disposed on the upper surface of the substrate member; and
   a third wavelength-selective material disposed on the upper surface of the substrate member;
   wherein the first wavelength-selective material emits light in a second selected wavelength range in response to light at the first selected wavelength range emitted from the LED device; and
   wherein the reflective member transmits substantially all of the light at the second selected wavelength range from the optical device.

2. The optical device of claim 1, wherein the first selected wavelength range comprises a wavelength range from about 395 nm to about 430 nm.

3. The optical device of claim 1, wherein the transparent dome forms a lens shape.

4. The optical device of claim 1, wherein the transparent dome comprises an A-lamp dome.

5. The optical device of claim 1, wherein the transparent dome comprises a component of an MR-16 lamp.

6. The optical device of claim 1, wherein the first wavelength-selective material comprises a phosphor.

7. The optical device of claim 1, wherein the second selected wavelength range comprises a wavelength range from about 440 nm to about 800 nm.

8. The optical device of claim 1, wherein the second wavelength selective material absorbs light at the second wavelength and emits light at a third selected wavelength.

9. The optical device of claim 1, wherein the first wavelength selective material, the second wavelength selective material, the third wavelength selective material, or a combination of any of the foregoing is disposed throughout a volume bounded by the transparent dome.

10. A method of fabricating an optical device comprising:
    providing a substrate member having an upper surface;
    providing a light emitting diode (LED) device configured to emit light in a first selected wavelength range, the LED device mounted on the upper surface of the substrate member;
    providing a reflective member surrounding the LED device, the reflective member comprising:
    a dichroic reflection coating; and
    a transparent dome;
    providing a first wavelength-selective material disposed on the upper surface of the substrate member around the LED device, an upper surface of the first wavelength-selective material being below an upper surface of the LED device;
    providing a second wavelength-selective material disposed on the upper surface of the substrate member; and
    providing a third wavelength-selective material disposed on the upper surface of the substrate member;
    wherein the first wavelength-selective material emits light in a second selected wavelength range in response to light in a first selected wavelength range emitted from the LED device; and
    wherein the reflective member transmits substantially all light at the second selected wavelength range e from the optical device.

11. The method of fabricating an optical device of claim 10, comprising providing the first wavelength selective material, the second wavelength selective material, the third wavelength selective material, or a combination of any of the foregoing throughout a volume bounded by the transparent dome.

12. The method of fabricating an optical device of claim 10, wherein each of the first wavelength selective material, the second wavelength selective material, and the third wavelength selective material is independently selected from a ceramic particle phosphor, a semiconductor particle phosphor, a ceramic plate phosphor, a semiconductor plate phosphor, an organic downconverter, an inorganic downconverter, an up converter, a quantum dot, and a nano-particle.

13. The method of fabricating an optical device of claim 10, wherein the first selected wavelength range comprises a wavelength range of about 395 nm to about 430 nm.

14. The method of fabricating an optical device of claim 10, wherein the transparent dome forms a lens shape.

15. The method of fabricating an optical device of claim 10, wherein the transparent dome comprises an A-lamp dome.

16. The method of fabricating an optical device of claim 10, wherein the transparent dome comprises a component of an MR-16 lamp.

17. The method of fabricating an optical device of claim 10, wherein the first wavelength-selective material comprises a phosphor.

18. The method of fabricating an optical device of claim 10, wherein the second selected wavelength range comprises a wavelength range from about 440 nm to about 800 nm.

19. The optical device of claim 10, wherein each of the first wavelength selective material, the second wavelength selective material, and the third wavelength selective material is independently selected from a ceramic particle phosphor, a semiconductor particle phosphor, a ceramic plate phosphor, a semiconductor plate phosphor, an organic downconverter, an inorganic downconverter, an up converter, a quantum dot, and a nano-particle.

20. The method of fabricating an optical device of claim 10, wherein the second wavelength selective material absorbs light at the second wavelength and emits light at a third selected wavelength.

* * * * *